(12) United States Patent
Ohashi (10) Patent No.: US 8,491,102 B2
(45) Date of Patent: Jul. 23, 2013

(54) DROPLET-EJECTING HEAD, METHOD FOR MANUFACTURING DROPLET-EJECTING HEAD, AND DROPLET-EJECTING APPARATUS

(75) Inventor: Koji Ohashi, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 225 days.

(21) Appl. No.: 13/045,147

(22) Filed: Mar. 10, 2011

(65) Prior Publication Data
US 2011/0228015 A1 Sep. 22, 2011

(30) Foreign Application Priority Data

Mar. 18, 2010 (JP) ................. 2010-062634

(51) Int. Cl.
*B41J 2/045* (2006.01)
*H02K 5/00* (2006.01)
*H02K 1/18* (2006.01)
*H02K 5/15* (2006.01)

(52) U.S. Cl.
USPC ........................................... 347/68; 310/311

(58) Field of Classification Search
None
See application file for complete search history.

(56) References Cited

U.S. PATENT DOCUMENTS

| 2006/0012644 A1* | 1/2006 | Yasui ............................... 347/68 |
| 2006/0214542 A1* | 9/2006 | Iwashita et al. ............... 310/364 |
| 2007/0228894 A1 | 10/2007 | Ishikura et al. |
| 2009/0060831 A1* | 3/2009 | Auer et al. .................... 423/598 |
| 2010/0192341 A1 | 8/2010 | Ishikura et al. |

FOREIGN PATENT DOCUMENTS

| JP | 2001-223404 | 8/2001 |
| JP | 2007-300071 | 11/2007 |

* cited by examiner

*Primary Examiner* — Matthew Luu
*Assistant Examiner* — Erica Lin
(74) *Attorney, Agent, or Firm* — Workman Nydegger (57) ABSTRACT

Provided are a droplet-ejecting head having good displacement and a droplet-ejecting apparatus. The droplet-ejecting head includes a pressure chamber; a piezoelectric element which includes a first electrode, a second electrode, and a piezoelectric layer disposed between the first electrode and the second electrode, the piezoelectric layer being made of a lead zirconate titanate; and a nozzle plate having a nozzle orifice communicating with the pressure chamber. The first electrode includes at least one lanthanum nickelate layer which is located on the piezoelectric layer side. The piezoelectric layer has a distribution in which the concentration of lanthanum and nickel decrease from the interface between the lanthanum nickelate layer and the piezoelectric layer toward the second electrode. Lanthanum is locally distributed in the piezoelectric layer. Nickel is globally distributed in the piezoelectric layer so as to have a plurality of peaks. At least one of the peaks is split.

4 Claims, 9 Drawing Sheets

FIG. 5
RATE OF REDUCTION IN DISPLACEMENT

DROPLET-EJECTING HEAD, METHOD FOR MANUFACTURING DROPLET-EJECTING HEAD, AND DROPLET-EJECTING APPARATUS

This application claims a priority to Japanese Patent Application No. 2010-062634 filed on Mar. 18, 2010 which is hereby expressly incorporated by reference herein in its entirety.

BACKGROUND

1. Technical Field

The present invention relates to a droplet-ejecting head, a method for manufacturing the droplet-ejecting head, and a droplet-ejecting apparatus.

2. Related Art

Ink jet processes are high-definition, high-speed printing processes and therefore are now in practical use. The following technique is useful in ejecting ink droplets: a technique using a piezoelectric actuator including electrodes and a piezoelectric layer sandwiched therebetween. A typical material for forming the piezoelectric layer is lead zirconate titanate ($Pb(Zr, Ti)O_3$ or PZT), which is a perovskite oxide, as disclosed in, for example, JP-A-2001-223404. Piezoelectric actuators for use in droplet-ejecting apparatuses represented by ink jet printers need to have improved displacement characteristics and dielectric characteristics.

It has been pointed out that in a piezoelectric actuator having such a structure, a material contained in a lower electrode diffuses into PZT to negatively affect a piezoelectric element. For example, JP-A-2007-300071 discloses a technique for controlling the composition of an electrode for the purpose of preventing the interdiffusion between materials contained in electrodes and a piezoelectric layer.

SUMMARY

Some aspects of the invention provide a droplet-ejecting head having good displacement characteristics and dielectric characteristics, a method for manufacturing the droplet-ejecting head, and a droplet-ejecting apparatus including the droplet-ejecting head.

A droplet-ejecting head according to an aspect of present invention includes a substrate having a pressure chamber; a piezoelectric element which is disposed on the substrate and which includes a first electrode, a second electrode, and a piezoelectric layer disposed between the first and second electrodes, the piezoelectric layer being made of a lead zirconate titanate ferroelectric; and a nozzle plate having a nozzle hole communicating with the pressure chamber. The first electrode includes at least one lanthanum nickelate layer which is located on the piezoelectric layer side and which is made of lanthanum nickelate. The piezoelectric layer has a distribution in which the concentration of lanthanum and the concentration of nickel decrease from the interface between the lanthanum nickelate layer and the piezoelectric layer toward the second electrode. Lanthanum is partly distributed in the piezoelectric layer. Nickel is globally distributed in the piezoelectric layer so as to have a plurality of peaks. At least one of the peaks is split.

The term "distribution" as used herein refers to the distribution of a component in a layer in the depth direction of the layer (the thickness direction of the layer) as determined by secondary ion mass spectrometry (SIMS).

The droplet-ejecting head is capable of having good displacement characteristics and dielectric characteristics because the piezoelectric layer contains lanthanum and nickel which each have a specific distribution.

A method for manufacturing a droplet-ejecting head according to an aspect of the present invention includes preparing a substrate; forming a first electrode on the substrate; forming a piezoelectric layer on the first electrode; forming a second electrode on the piezoelectric layer; forming a pressure chamber in the substrate; and forming a nozzle plate having a nozzle hole communicating with the pressure chamber. The formation of the first electrode includes forming a lanthanum nickelate layer made of lanthanum nickelate on the piezoelectric layer side. The piezoelectric layer is formed by a solution process. The solution process uses a material in which the molar proportion of lead is 1.04 to 1.08 with respect to the sum of zirconium and titanium. Heat treatment for crystallization is performed at 700° C. or higher in the formation of the piezoelectric layer.

According to the method, the droplet-ejecting head can be obtained.

In the method, heat treatment for crystallization may be performed at a temperature of 750° C. to 850° C. in the formation of the piezoelectric layer.

A droplet-ejecting apparatus according to an aspect of the present invention includes the droplet-ejecting head.

BRIEF DESCRIPTION OF THE DRAWINGS

The invention will be described with reference to the accompanying drawings, wherein like numbers reference like elements.

DESCRIPTION OF EXEMPLARY EMBODIMENTS

1. Droplet-Ejecting Head

Figure 1:
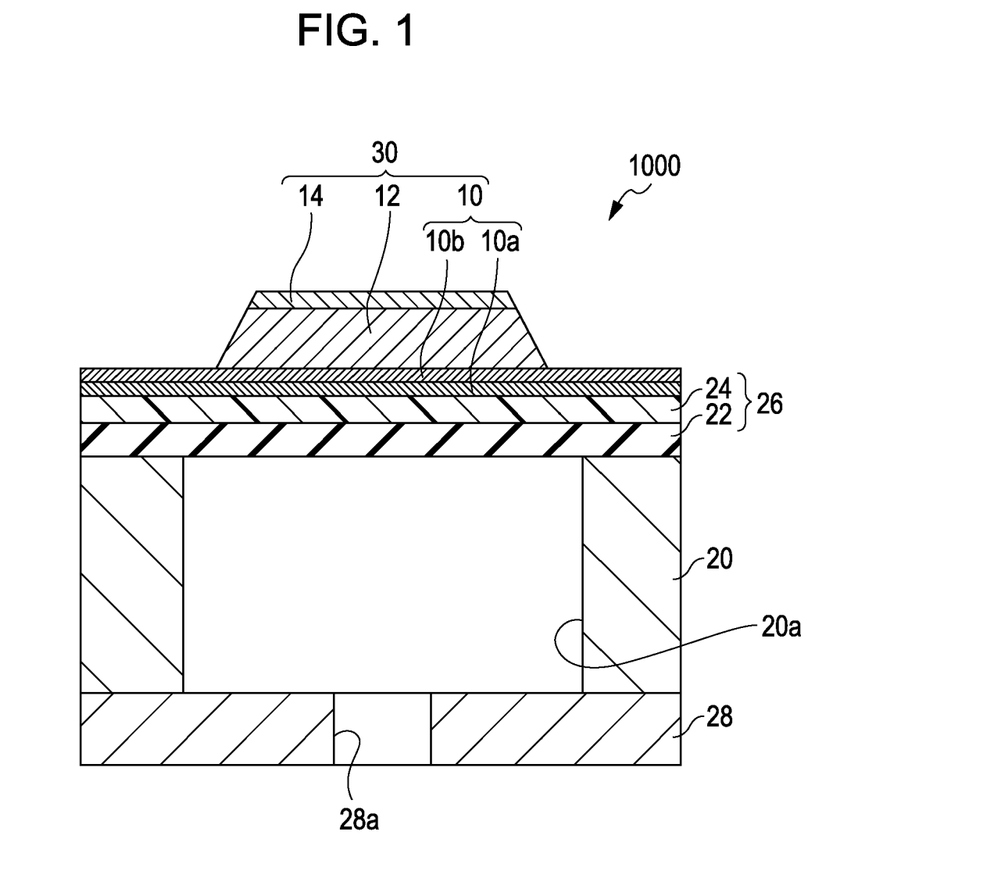
FIG. 1 is a schematic sectional view of a droplet-ejecting head according to an embodiment of the present invention.
Figure 2:
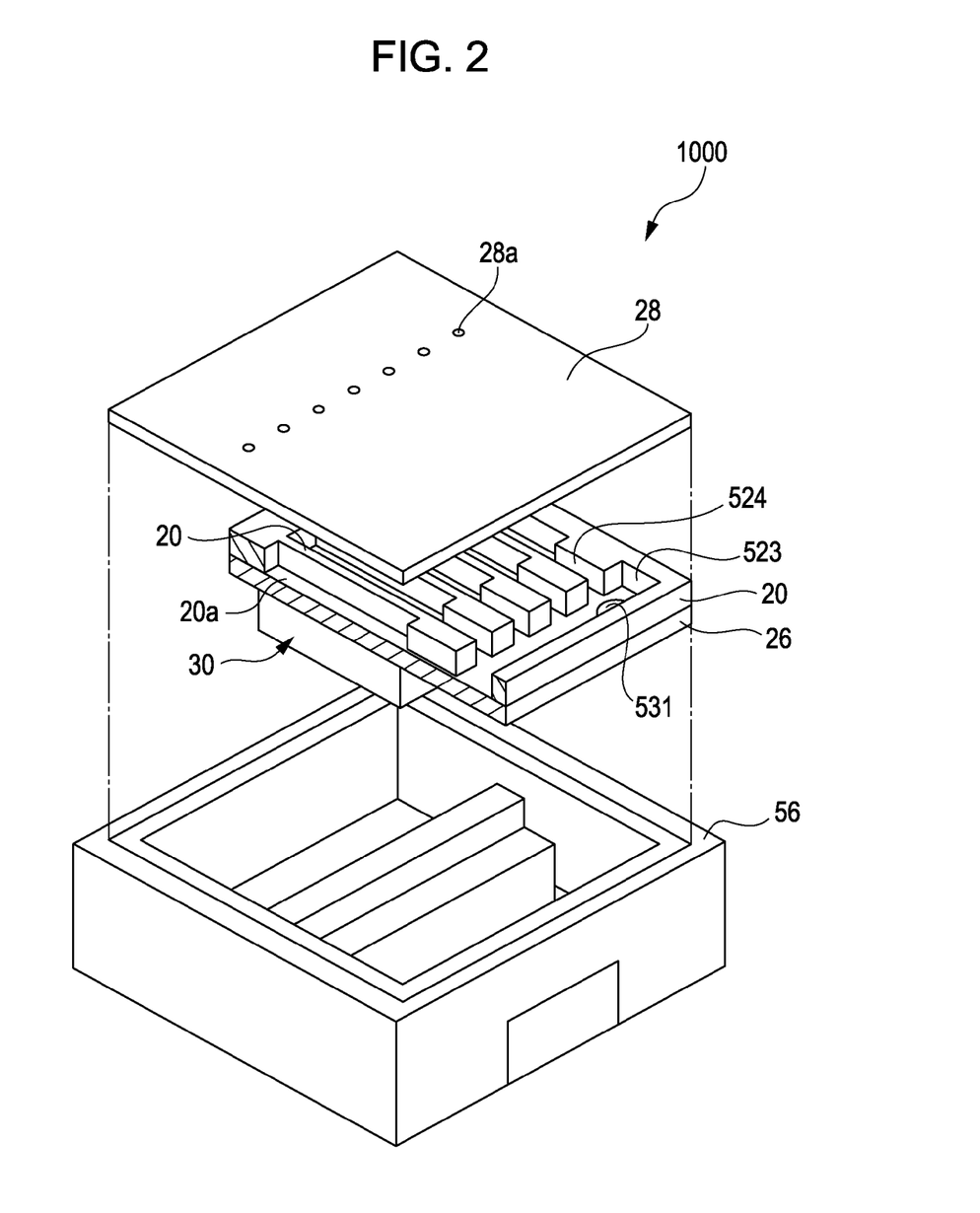
FIG. 2 is a schematic exploded perspective view of the droplet-ejecting head shown in FIG. 1.
Figure 3A:
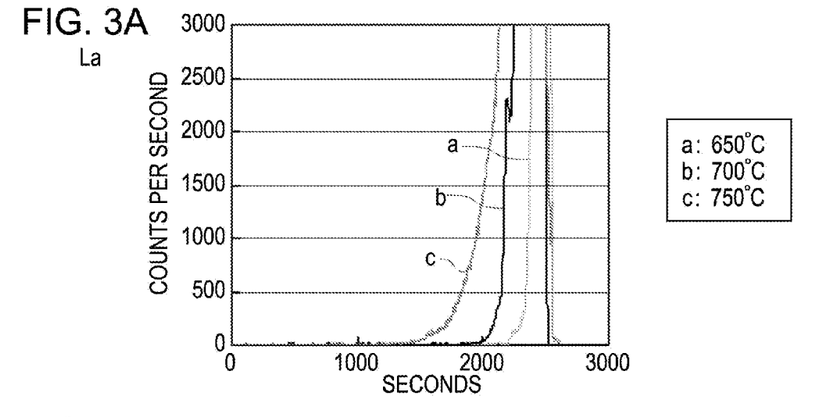
FIG. 3A is a graph showing results obtained by analyzing La by SIMS in an experiment.
Figure 3B:
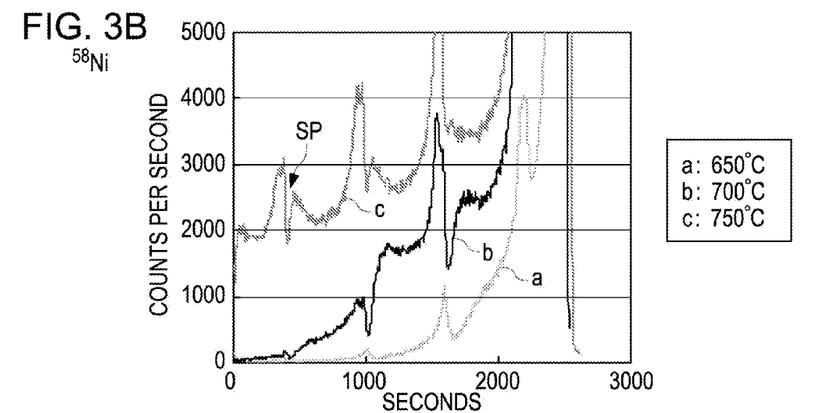
FIG. 3B is a graph showing results obtained by analyzing $^{58}Ni$ by SIMS in an experiment.
Figure 3C:
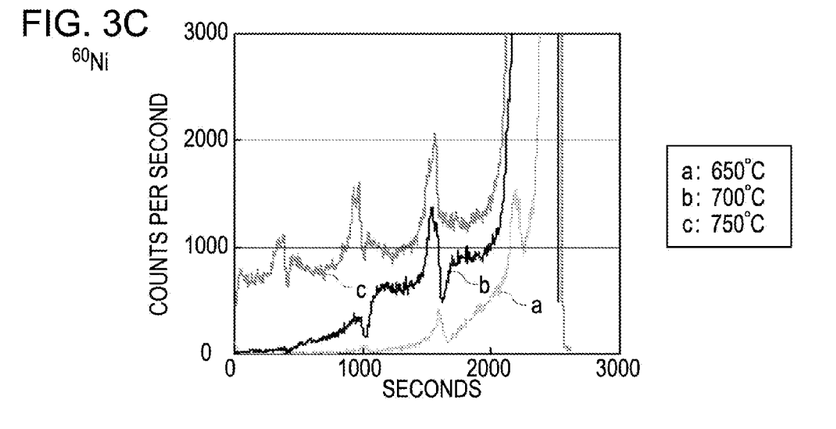
FIG. 3C is a graph showing results obtained by analyzing $^{60}Ni$ by SIMS in an experiment.

FIG. 1 is a schematic sectional view of a droplet-ejecting head 1000 according to an embodiment of the present invention. FIG. 2 is a schematic exploded perspective view of the droplet-ejecting head 1000, which is shown upside down. In FIG. 2, one of piezoelectric elements 30 is simply shown for convenience. FIGS. 3A to 3C are graphs showing results obtained by analyzing piezoelectric layers by SIMS.

The droplet-ejecting head 1000 includes a pressure chamber-bearing substrate (hereinafter referred to as "pressure chamber substrate") 20, an elastic plate 26, a nozzle plate 28, and the piezoelectric elements 30.

The pressure chamber substrate 20 may be, for example, a single-crystalline (110) silicon substrate (with a <110> orientation). The pressure chamber substrate 20 has pressure chambers 20a having openings.

The elastic plate 26 is disposed on the pressure chamber substrate 20. The elastic plate 26 may include, for example, an etching stopper layer 22 and an elastic layer 24 disposed on the etching stopper layer 22. The etching stopper layer 22 is made of, for example, silicon dioxide ($SiO_2$). The etching stopper layer 22 has a thickness of, for example, 500 nm to 2,000 nm. The elastic layer 24 is made of, for example, zirconium oxide ($ZrO_2$). The elastic layer 24 has a thickness of, for example, 50 nm to 500 nm. The elastic plate 26 need not include the etching stopper layer 22. The elastic plate 26 may further include an adhesive layer, which is not shown, disposed on the elastic layer 24. The adhesive layer may be made of, for example, titanium oxide. The adhesive layer has a thickness of, for example, 20 nm to 50 nm.

The piezoelectric elements 30 are arranged on the elastic plate 26. The piezoelectric elements 30 can bend the elastic plate 26. The piezoelectric elements 30 each include a portion of a first electrode 10 disposed on the elastic plate 26 (disposed on the elastic layer 24 in FIG. 1), a piezoelectric layer 12 disposed on the first electrode 10, and a second electrode 14 disposed on the piezoelectric layer 12.

The first electrode 10 is one for applying a voltage to the piezoelectric layer 12. The first electrode 10 includes a low-resistance layer 10a and a lanthanum nickelate layer 10b disposed on the low-resistance layer 10a. The first electrode 10 need not include the low-resistance layer 10a.

The low-resistance layer 10a is made of a conductive material lower in resistivity than lanthanum nickelate. The conductive material may contain at least one of a metal, an oxide of the metal, and an alloy containing the metal. The metal is at least one selected from the group consisting of, for example, Pt, Ir, Ru, Ag, Au, Cu, Al, and Ni. The metal oxide is, for example, $IrO_2$, $RuO_2$, or the like. Examples of the alloy containing the metal include Pt—Ir, Ir—Al, Ir—Ti, Pt—Ir—Al, Pt—Ir—Ti, and Pt—Ir—Al—Ti. In this embodiment, the crystal orientation of the conductive material is not particularly limited and may be, for example, (111). The low-resistance layer 10a may have a thickness of, for example, 10 nm to 150 nm.

The lanthanum nickelate layer 10b is in contact with the piezoelectric layer 12. The lanthanum nickelate layer 10b is made of lanthanum nickelate. The term "made of lanthanum nickelate" as used herein covers not only the term "made of lanthanum nickelate alone" but also the term "made of a solid solution formed by partially replacing nickel in lanthanum nickelate with another metal". Such a metal may be at least one selected from the group consisting of iron, aluminum, manganese, and cobalt. Lanthanum nickelate is represented by the formula $LaNiO_y$, wherein $2 \leq y \leq 4$, and preferably $LaNiO_3$. The proportion of La and Ni in lanthanum nickelate may be non-stoichiometric.

Lanthanum nickelate is likely to be predominantly (100)-oriented and has a function of controlling the orientation of the piezoelectric layer 12. Therefore, crystal grains in the piezoelectric layer 12, which is disposed on the lanthanum nickelate layer 10b, are predominantly (100)-oriented by the influence of the orientation of lanthanum nickelate. The lanthanum nickelate layer 10b may have a thickness of, for example, 10 nm to 140 nm.

The piezoelectric layer 12 is made of a lead zirconate titanate ferroelectric. Examples of the lead zirconate titanate ferroelectric include lead zirconate titanate ($Pb(Zr, Ti)O_3$ or PZT) and a lead zirconate titanate solid solution. An example of the lead zirconate titanate solid solution is lead zirconate titanate niobate ($Pb(Zr, Ti, Nb)O_3$ or PZTN). Lead zirconate titanate used may be doped with an element such as Ca or La.

When the piezoelectric layer 12 is made of, for example, lead zirconate titanate represented by the formula $PbZr_xTi_{1-x}O_3$, x preferably ranges from 0.35 to 0.55 and more preferably 0.4 to 0.55. When x is within the above range, the piezoelectric layer 12 can be controlled to have a monoclinic structure. The crystal structure of the piezoelectric layer 12 does not solely depend on the value of x but also depends on the stress therein, lattice defects, and crystal dislocations.

The thickness of the piezoelectric layer 12 is not particularly limited and may be, for example, 300 nm to 1,500 nm.

A feature of this embodiment is that lanthanum and nickel are present in the piezoelectric layer 12 in specific distributions as shown in FIGS. 3A to 3C. FIGS. 3A to 3C show SIMS results obtained in experiments below. In particular, FIG. 3A shows the distribution of lanthanum, FIG. 3B shows the distribution of $^{58}Ni$, which is an isotope of nickel, and FIG. 3C shows the distribution of $^{60}Ni$, which is another isotope of nickel.

Lanthanum is distributed in the piezoelectric layer 12 such that the concentration of lanthanum decreases from the interface between the lanthanum nickelate layer 10b and the piezoelectric layer 12 toward the second electrode 14 as shown in FIG. 3A. In particular, lanthanum is distributed in a region of the piezoelectric layer 12 such that the concentration of lanthanum decreases from the interface between the lanthanum nickelate layer 10b and the piezoelectric layer 12 toward the second electrode 14.

With reference to FIGS. 3B and 3C, the piezoelectric layer 12 has a region which is wider than the lanthanum-distributed region and in which the concentration of nickel decreases from the interface between the lanthanum nickelate layer 10b and the piezoelectric layer 12 toward the second electrode 14. Nickel is globally distributed in the piezoelectric layer 12 as shown in FIGS. 3B and 3C (see example lines denoted by Symbols b and c). The distribution of nickel in the piezoelectric layer 12 has a plurality of peaks. At least one of the peaks is split (divided) (see the example lines denoted by Symbols b and c). That is, as shown in FIG. 3B, this peak has a deep split SP that divides this peak. The positions of the peaks of nickel correspond to regions of interlayer interfaces formed by performing firing several times during the formation of the piezoelectric layer 12.

Since lanthanum and nickel are distributed as described above, there are advantages below.

Since lanthanum is present in a portion of the piezoelectric layer 12 that is located near the interface between the lanthanum nickelate layer 10b and the piezoelectric layer 12, lead can be prevented from being distributed near the interface therebetween. This prevents oxygen in the piezoelectric layer 12 from being lost due to the distribution of lead to improve leakage current characteristics (dielectric characteristics), resulting in improvements in fatigue characteristics and displacement characteristics.

Since nickel is present in a portion of the piezoelectric layer 12 that is located near the interface between the lanthanum nickelate layer 10b and the piezoelectric layer 12 and also present in the whole piezoelectric layer 12, Ni is located at a B-site ($Zr^{4+}$ or $Ti^{4+}$) of the lead zirconate titanate ferroelectric in the form of $Ni^{2+}$ (bivalent) or $Ni^{3+}$ (trivalent). Therefore, oxygen defects are formed in the lead zirconate titanate ferroelectric, whereby the movement of a domain wall is hindered and therefore the coercive electric field is increased. This allows the lead zirconate titanate ferroelectric to be hard.

Since the stress resulting from a substrate and the internal stress of the piezoelectric layer 12 are concentrated on grain boundaries and interlayer interfaces, there is a problem in that the grain boundaries and interlayer interfaces are broken during the operation of an element. However, in this embodiment, nickel is distributed in the portion of the piezoelectric layer 12 that is located near the interface and therefore a soft portion of the piezoelectric layer 12 that is a cause of breakage can be hardened; hence, dielectric breakdown (dielectric characteristic) is probably improved without reducing the piezoelectric displacement.

The nickel peak is split and therefore nickel is prevented from being locally distributed in the depth direction. This probably suppresses a leakage current.

The second electrode 14 is one for applying a voltage to the piezoelectric layer 12. The second electrode 14 may include, for example, an iridium (Ir) layer. The thickness of the second electrode 14 is not particularly limited and may be 20 nm to 200 nm.

In this embodiment, the piezoelectric layer 12 and second electrode 14 of each piezoelectric element 30 are disposed above a corresponding one of the pressure chambers 20a. The first electrode 10 of the piezoelectric element 30 may be disposed on, for example, the pressure chamber substrate 20 so as to function as a common electrode.

The nozzle plate 28 has nozzle holes 28a each communicating with a corresponding one of the pressure chambers 20a. From the nozzle holes 28a, ink droplets or the like are ejected. In the nozzle plate 28, the nozzle holes 28a, of which the number is large, are arranged in, for example, one line. The nozzle plate 28 may be, for example, a rolled plate of stainless steel (SUS), a silicon substrate, or the like. In general use, the nozzle plate 28 is fixed under the pressure chamber substrate 20 (on the pressure chamber substrate 20 in FIG. 2). As shown in FIG. 2, a housing 56 can accommodate the droplet-ejecting head 1000. The housing 56 is made of, for example, a resin material or a metal material.

With reference to FIG. 2, the pressure chamber substrate 20 divides a space between the nozzle plate 28 and the elastic plate 26 into a reservoir (liquid storage portion) 523, supply ports 524, and a plurality of cavities (the pressure chambers) 20a. The elastic plate 26 has a through-hole 531 extending therethrough in the thickness direction. The reservoir 523 temporally stores a liquid or dispersion (hereinafter referred to as "ink"), such as ink, supplied from an external unit (for example, an ink cartridge) through the through-hole 531. The ink is supplied to the pressure chambers 20a from the reservoir 523 through the supply ports 524.

The pressure chambers 20a are each provided with a corresponding one of the nozzle holes 28a. The pressure chambers 20a are variable in volume due to the deformation of the elastic plate 26. The ink is ejected from the pressure chambers 20a by the change in volume thereof.

The piezoelectric elements 30 are electrically connected to a piezoelectric element-driving circuit (not shown) and can be operated (vibrated or deformed) on the basis of a signal transmitted from the piezoelectric element-driving circuit. The elastic plate 26 is deformed by the deformation of the piezoelectric elements 30, whereby the pressure in each pressure chamber 20a can be momentarily increased.

In this embodiment, the droplet-ejecting head 1000 includes the piezoelectric elements 30 and therefore has a small rate of reduction in displacement, excellent displacement characteristics, and good dielectric characteristics. These features apply to a modification below.

Figure 8:
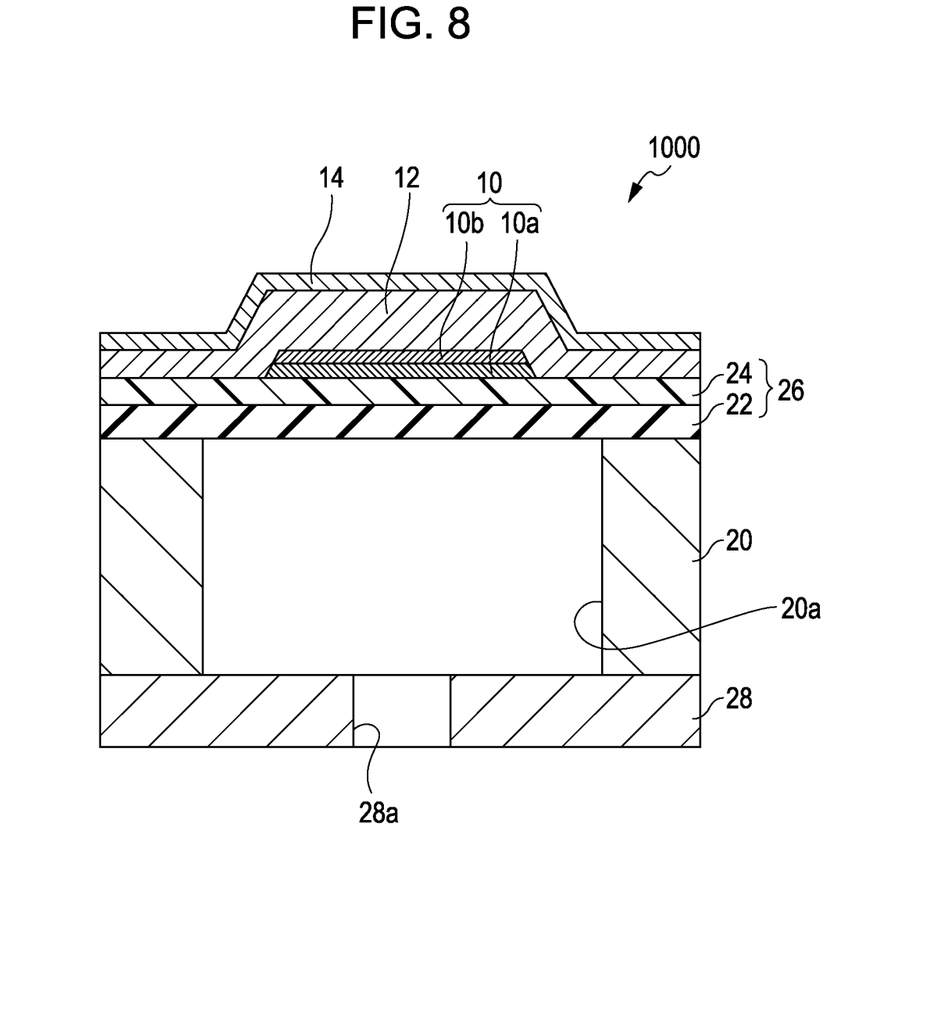
FIG. 8 is a schematic view of a modification of the droplet-ejecting head shown in FIG. 1.

FIG. 8 shows a modification of the droplet-ejecting head 1000 of this embodiment. Substantially the same members as those shown in FIG. 1 are designated by the same reference numerals as those used in FIG. 1 and will not be described in detail. Differences between the modification and the droplet-ejecting head 1000 shown in FIG. 1 are principally described below.

In a droplet-ejecting head 1000 shown in FIG. 8, the configuration of an electrode included in a piezoelectric element 30 is different from that shown in FIG. 1. In particular, a first electrode 10 and a second piezoelectric layer 12b are located only above a pressure chamber 20a. A piezoelectric layer 12 and a second electrode 14 extend outside the pressure chamber 20a in plan view. A piezoelectric layer located outside a region forming the first electrode 10 has a thickness less than that of a piezoelectric layer included in the piezoelectric element 30. For the modification, the second electrode 14 can function as a common electrode. In the modification shown in FIG. 8, the piezoelectric layer 12 extends outside the region forming the first electrode 10 and therefore the natural frequency of an elastic plate 26 can be tuned.

2. Method for Manufacturing Droplet-Ejecting Head

A method for manufacturing the droplet-ejecting head 1000 according to this embodiment will now be described with reference to FIGS. 1 and 2.

A (110)-oriented silicon substrate is prepared as a base for the pressure chamber substrate 20.

The etching stopper layer 22 is formed on the base. The etching stopper layer 22 can be formed by, for example, a thermal oxidation process, a chemical vapor deposition (CVD) process, or a similar process.

The elastic layer 24 is formed on the etching stopper layer 22. The elastic layer 24 can be formed by, for example, a CVD process, a sputtering process, a vapor deposition process, or a similar process.

The low-resistance layer 10a is formed on the elastic layer 24. In this embodiment, the crystal orientation of the conductive material contained in the low-resistance layer 10a is not particularly limited as described above; hence, a process and conditions for forming the low-resistance layer 10a can be appropriately selected. The low-resistance layer 10a can be formed by, for example, a sputtering process, a CVD process, or a similar process. The formation temperature of the low-resistance layer 10a may be room temperature to 600° C.

The lanthanum nickelate layer 10b is formed on the low-resistance layer 10a. The lanthanum nickelate layer 10b can be formed by, for example, a sputtering process. A target used in this sputtering process may be one prepared by sintering a mixture of a $La_2O_3$ powder and a $NiO_x$ powder. The ratio of nickel to lanthanum in the target can be adjusted to a desired value by adjusting the mixing ratio of the $NiO_x$ powder to the $La_2O_3$ powder. In the case of forming the lanthanum nickelate layer 10b by, for example, an RF magnetron sputtering process, the RF power used may be 500 W to 3 kW and the substrate temperature may be 150° C. to 300° C. The percentage ($O_2/(Ar+O_2)$) of oxygen in an argon/oxygen mixture used may be 0% to 50%. The first electrode 10 is formed through the above steps.

The piezoelectric layer 12 is formed on the lanthanum nickelate layer 10b. The piezoelectric layer 12 can be formed by, for example, a solution process such as a sol-gel process or a MOD process.

In the case of using lead zirconate titanate (PZT) to form the piezoelectric layer 12, the piezoelectric layer 12 can be formed as described below.

The lanthanum nickelate layer 10b is coated with a sol-gel material for producing PZT by a process such as a spin coating process (a coating step). The sol-gel material may have a lead content greater than the stoichiometric proportion of lead in PZT ($PbZr_xTi_{1-x}O_3$). The molar proportion of lead in the sol-gel material is preferably 1.04 to 1.08 with respect to the sum of zirconium and titanium and more preferably 1.04 to 1.06. When the molar proportion of lead is greater than 1.08, there may be a problem in that a surplus of lead precipitates on PZT to cause a reduction in breakdown voltage.

A coating of the sol-gel material is dried at a temperature of 100° C. to 200° C. for three minutes to five minutes on a hotplate or the like (a drying step). The drying step may be repeated several times at different temperatures. Organic components are removed from the coating in such a manner that the coating is heat-treated at a temperature of 350° C. to 450° C. for three minutes to five minutes on a hotplate or the like (a degreasing step).

The coating step, the drying step, and the degreasing step are repeated three to five times such that the coating has a desired thickness.

The coating is fired (crystallized) at a temperature of 700° C. or higher, preferably 750° C. to 850° C., by rapid thermal annealing (RTA) or heat treatment using a diffusion furnace (a firing step).

The coating step, the drying step, the degreasing step, and the firing step are repeated, whereby the piezoelectric layer 12 is formed so as to have a desired thickness.

It has been verified that good piezoelectric characteristics and particularly good dielectric characteristics can be obtained in such a manner that the surplus of lead in the sol-gel material, which is used to produce PZT, is adjusted to be less than usual and the coating is fired at a slightly elevated temperature.

The second electrode 14 is formed on the piezoelectric layer 12. The second electrode 14 can be formed by, for example, a sputtering process, a vacuum vapor deposition process, or a similar process.

The second electrode 14, the piezoelectric layer 12, and the first electrode 10 are patterned such that the piezoelectric elements 30 are formed at positions corresponding to those of the pressure chambers 20a, which are formed in a subsequent step.

The base is patterned such that recessed portions for forming the pressure chambers 20a are formed at positions corresponding to those of the piezoelectric elements 30 and recessed portions for forming the reservoir 523 and the supply ports 524 are formed at predetermined positions.

In this embodiment, wet etching (anisotropic etching) is preferably performed using a high-concentration alkaline aqueous solution because the (110)-oriented silicon substrate is used as the base for the pressure chamber substrate 20. The etching stopper layer 22 can function as an etching stopper during wet etching using the high-concentration alkaline aqueous solution and therefore the pressure chamber substrate 20 can be readily prepared.

The base is partly etched off in the thickness direction thereof, whereby the pressure chamber substrate 20 is prepared. Unetched portions remaining in the pressure chamber substrate 20 function as walls 522.

The nozzle plate 28 having the nozzle holes 28a is bonded to the pressure chamber substrate 20 such that the nozzle holes 28a are each aligned with a corresponding one of the recessed portions for forming the pressure chambers 20a. This forms the pressure chambers 20a, the reservoir 523, and the supply ports 524. The nozzle plate 28 can be bonded to the pressure chamber substrate 20 by, for example, a bonding process using an adhesive, a fusion process, or a similar process. The pressure chamber substrate 20 is then attached to the housing 56.

The droplet-ejecting head 1000 according to this embodiment can be manufactured through the above steps.

3. Experiments (1) Preparation of Samples

A silicon dioxide layer with a thickness of 1,000 nm and a zirconium oxide layer with a thickness of 400 nm were formed on a (110)-oriented single-crystalline silicon substrate in that order. The silicon dioxide layer was formed by thermally oxidizing the silicon substrate. The zirconium oxide layer was formed in such a manner that a layer of zirconium was deposited on the silicon dioxide layer by a sputtering process and was then thermally oxidized. A titanium oxide layer was formed on the zirconium oxide layer by a reactive sputtering process so as to have a thickness of 40 nm. An iridium layer was formed on the titanium oxide layer by a sputtering process so as to have a thickness of 50 nm. A lanthanum nickelate layer was formed on the iridium layer by an RF sputtering process so as to have a thickness of 40 nm. Conditions for forming the lanthanum nickelate layer were as follows: an RF power of 1 kW and a substrate temperature of 250° C.

The lanthanum nickelate layer was coated with a sol-gel material for producing PZT by a spin coating process. The sol-gel material had a Pb-to-Zr-to-Ti ratio of 1.06:0.5:0.5. A coating formed thereby was heated at 100° C. for five minutes, at 150° C. for five minutes on a hotplate, and then at 400° C. for five minutes on a hotplate. After the coating step and the heating step were repeated three times, the coating was fired in such a manner that the coating was heat-treated at 750° C. for five minutes in an oxygen atmosphere by RTA.

The coating step, the heating step, and the firing step were repeated five times, whereby a PZT layer with a thickness of 1,350 nm was formed.

An iridium layer was formed on the PZT layer by a sputtering process so as to have a thickness of 50 nm, whereby Sample 1c was prepared. Sample 1a was prepared in substantially the same manner as that used to prepare Sample 1c except that the firing temperature was 650° C. Sample 1b was prepared in substantially the same manner as that used to prepare Sample 1c except that the firing temperature was 700° C. Sample 1a was one for comparison and Samples 1b and 1c were those corresponding to examples.

Sample 2c for comparison was prepared in substantially the same manner as that used to prepare Sample 1c except that a sol-gel material having a Pb-to-Zr-to-Ti ratio of 1.12:0.5:0.5 was used. Sample 2a was prepared in substantially the same manner as that used to prepare Sample 2c except that the firing temperature was 650° C. Sample 2b was prepared in substantially the same manner as that used to prepare Sample 1c except that the firing temperature was 700° C.

(2) Evaluation of Samples (A) SIMS

The PZT layer and lanthanum nickelate layer (LNO layer) of each sample having no iridium layer functioning as a second electrode were analyzed for composition by SIMS. The analysis results are shown in FIGS. 3A to 3C. FIG. 3A shows the distribution of lanthanum, FIG. 3B shows the distribution of $^{58}Ni$, and FIG. 3C shows the distribution of $^{60}Ni$. FIGS. 3A to 3C show results obtained by analyzing Samples 1a, 1b, and 1c, which were prepared at a firing temperature of 650° C., 700° C., and 750° C., respectively, by SIMS. For conditions for SIMS, primary ions used were oxygen ions and the acceleration voltage was 1 kV.

FIGS. 3A to 3C clarify the difference between the distribution of lanthanum and distribution of nickel. That is, lanthanum is partly distributed in the LNO layer and has a distribution substantially linearly sloping toward the surface of the PZT layer.

Nickel is globally distributed in each PZT layer and has a distribution that slopes more gently than the distribution of lanthanum slopes. Nickel has a peak located near the surface of each coating fired for forming the PZT layer. In each of Samples 1b and 1c corresponding to examples, nickel is globally distributed in the PZT layer and has a plurality of peaks. The peaks are split (divided). As shown in FIG. 3B, one of the peaks has a deep split SP that divides this peak.

FIGS. 3A to 3C illustrate that the distribution of lanthanum and the distribution of nickel depend on the firing temperature. That is, the distribution range of lanthanum increases with an increase in firing temperature. The distribution range and concentration of lanthanum increase with an increase in firing temperature. In Sample 1a, which is for comparison and has a firing temperature of 650° C., nickel is not globally distributed in the PZT layer.

Figure 4A:
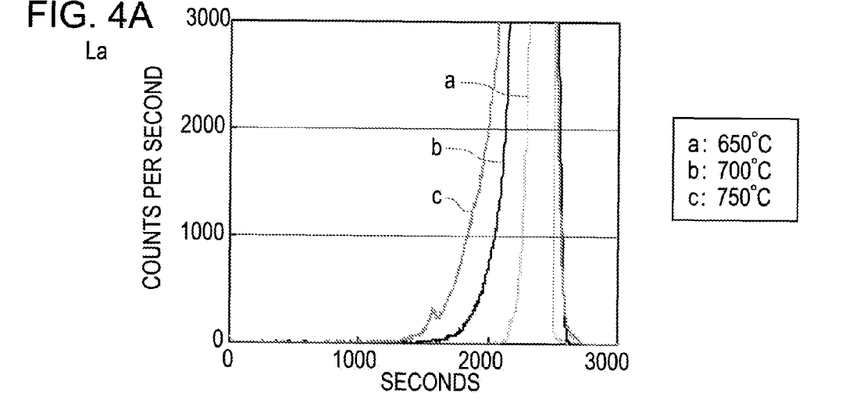
FIG. 4A is a graph showing results obtained by analyzing La by SIMS in an experiment.
Figure 4B:
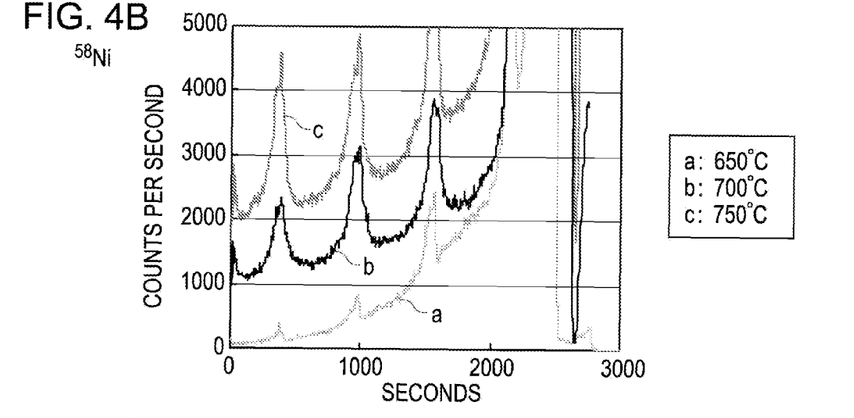
FIG. 4B is a graph showing results obtained by analyzing $^{58}Ni$ by SIMS in an experiment.
Figure 4C:
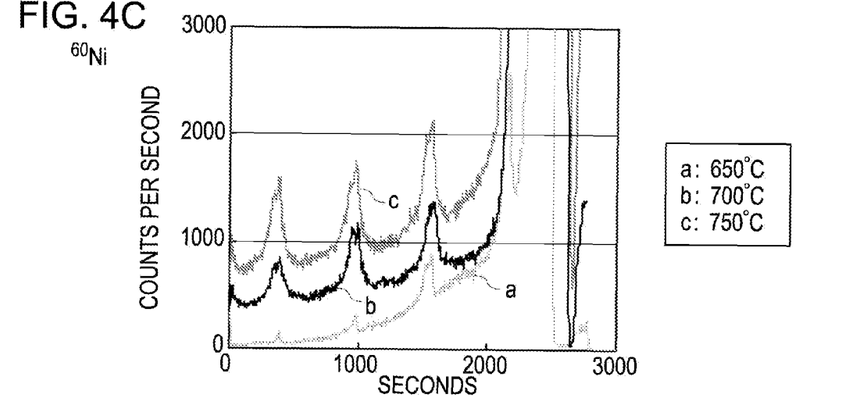
FIG. 4C is a graph showing results obtained by analyzing $^{60}Ni$ by SIMS in an experiment.

FIGS. 4A to 4C show results obtained by analyzing Samples 2a to 2c, which are for comparison, by SIMS.

FIGS. 4A to 4C illustrate that first, nickel is globally distributed in the PZT layer of the Sample 2a, which has a firing temperature of 650° C.; second, the distribution range of lanthanum hardly depends on the content of lead in the sol-gel material; third, nickel peaks are greater than those of Samples 1a to 1c; and fourth, the nickel peaks have no deep splits that divide the nickel peaks unlike those of Samples 1b and 1c, because the content of lead in the sol-gel material is 1.12.

(B) Rate of Reduction in Displacement

Figure 5:
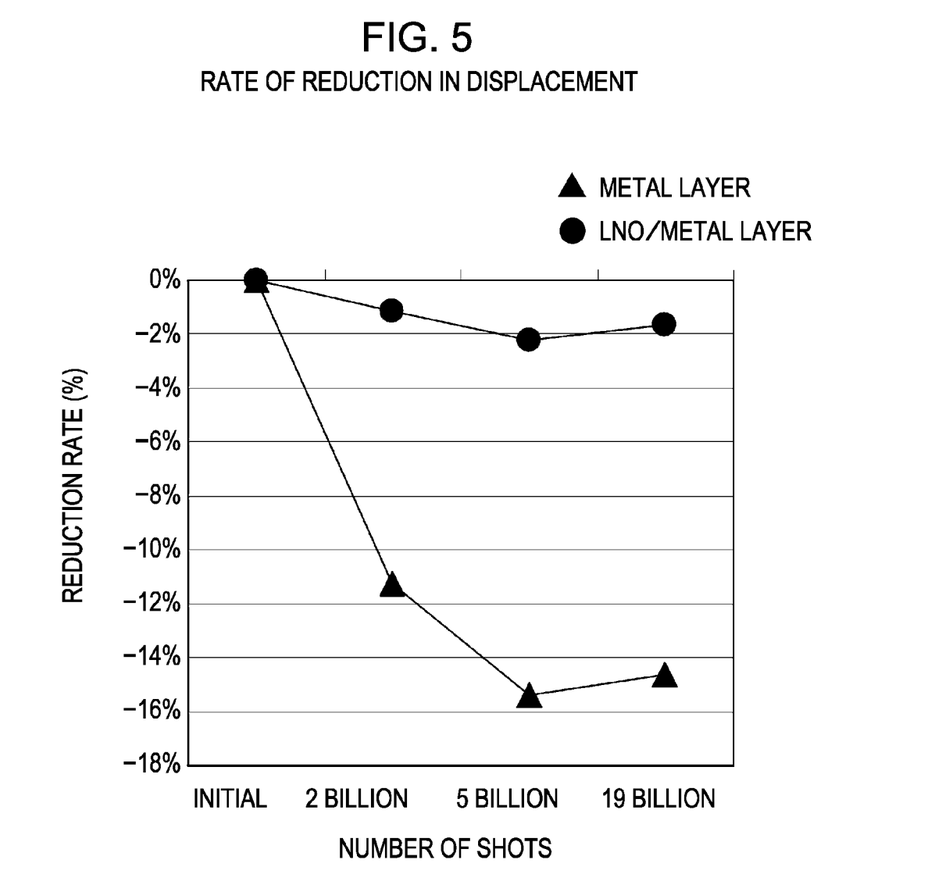
FIG. 5 is a graph showing the rate of reduction in displacement determined in an experiment.

FIG. 5 shows the rate of reduction in displacement of Sample 1c and that of Sample 3 which is for comparison. Sample 3 is substantially the same as Sample 1c except that unlike Sample 1c, Sample 3 does not include any lanthanum nickelate layer and includes a first electrode made of platinum.

The rate of reduction in displacement was determined in such a manner that an ink ejection signal was repeatedly applied to Samples 1c and 3 nineteen billion times and Samples 1c and 3 were measured for displacement with a laser Doppler vibrometer.

FIG. 5 illustrates that Sample 3 has a larger change in strain and a larger rate of reduction in displacement as compared to Sample 1c. On the other hand, Sample 1c has a small change in strain and a small rate of reduction in displacement because PZT is hardened by the distribution of nickel. In particular, Sample 1c has a rate of reduction in displacement of about 2% at the 19 billionth shot. On the other hand, the rate of reduction in displacement of Sample 3c initially decreases significantly and is about 15% at the 19 billionth shot.

(C) Dielectric Characteristics

Figure 6:
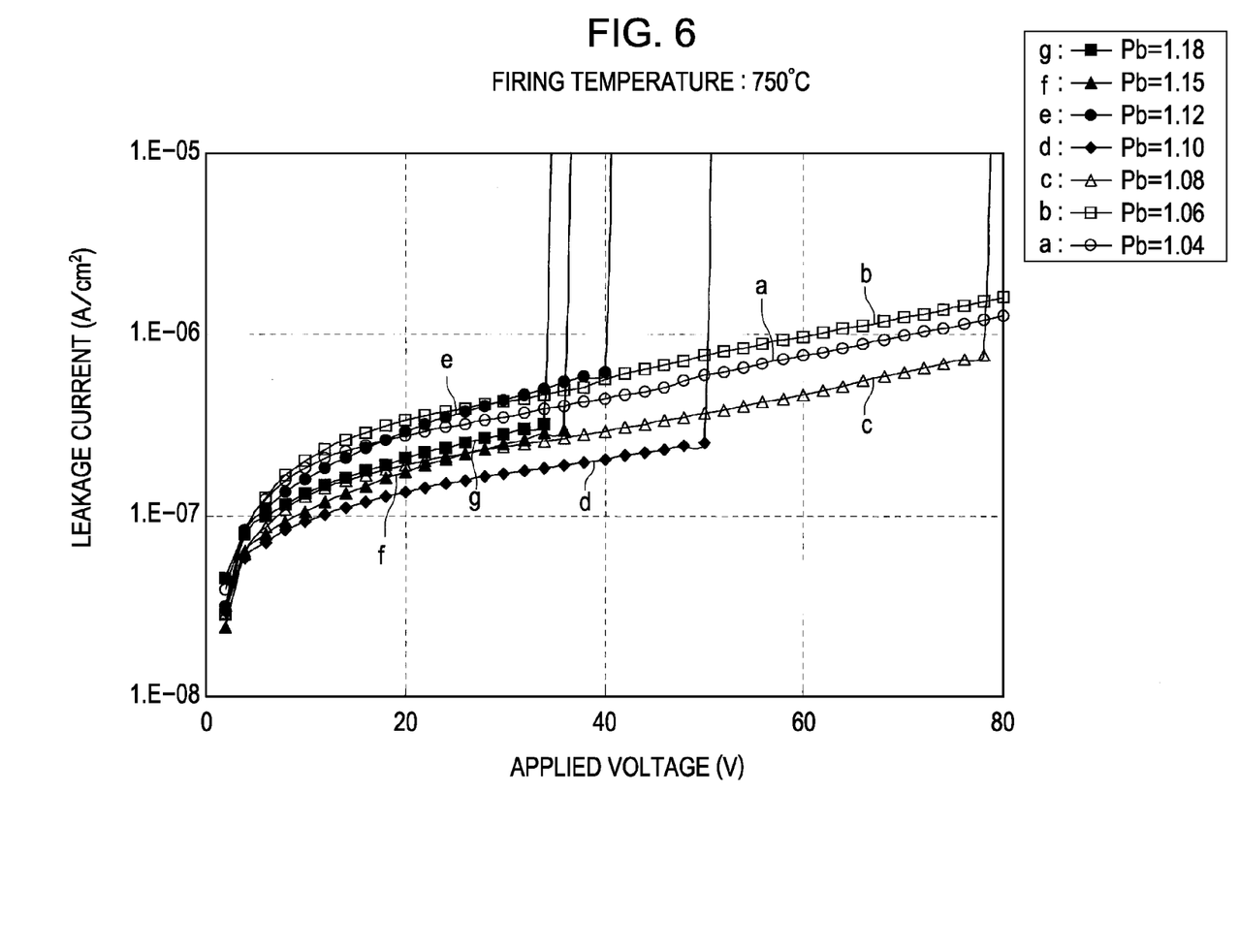
FIG. 6 is a graph showing leakage current characteristics determined in an experiment.

FIG. 6 shows the relationship between the applied voltage and leakage current of each of samples corresponding to examples or comparative examples. Each sample was prepared in substantially the same manner as that used to prepare Sample 1c except that the molar proportion of lead in a sol-gel material used to prepare the sample was different from the molar proportion of lead in the sol-gel material used to prepare Sample 1c.

With reference to FIG. 6, a line denoted by Symbol a shows results obtained from Sample a (Pb=1.04), a line denoted by Symbol b shows results obtained from Sample b (Pb=1.06) identical to Sample 1, a line denoted by Symbol c shows results obtained from Sample c (Pb=1.08), a line denoted by Symbol d shows results obtained from Sample d (Pb=1.10), a line denoted by Symbol e shows results obtained from Sample e (Pb=1.12), a line denoted by Symbol f shows results obtained from Sample f (Pb=1.15), and a line denoted by Symbol g shows results obtained from Sample g (Pb=1.18).

As is clear from FIG. 6, Samples a to c corresponding to examples have a dielectric strength of about 80 V or more and Samples d to g corresponding to comparative examples have a dielectric strength of about 50 V or less. This suggests that when the molar proportion of lead in a sol-gel material used is 1.10 or more, the distribution of nickel in a PZT layer is excessive, the leakage current increases, and the PZT layer is excessively hard and therefore is readily breakable.

Figure 7:
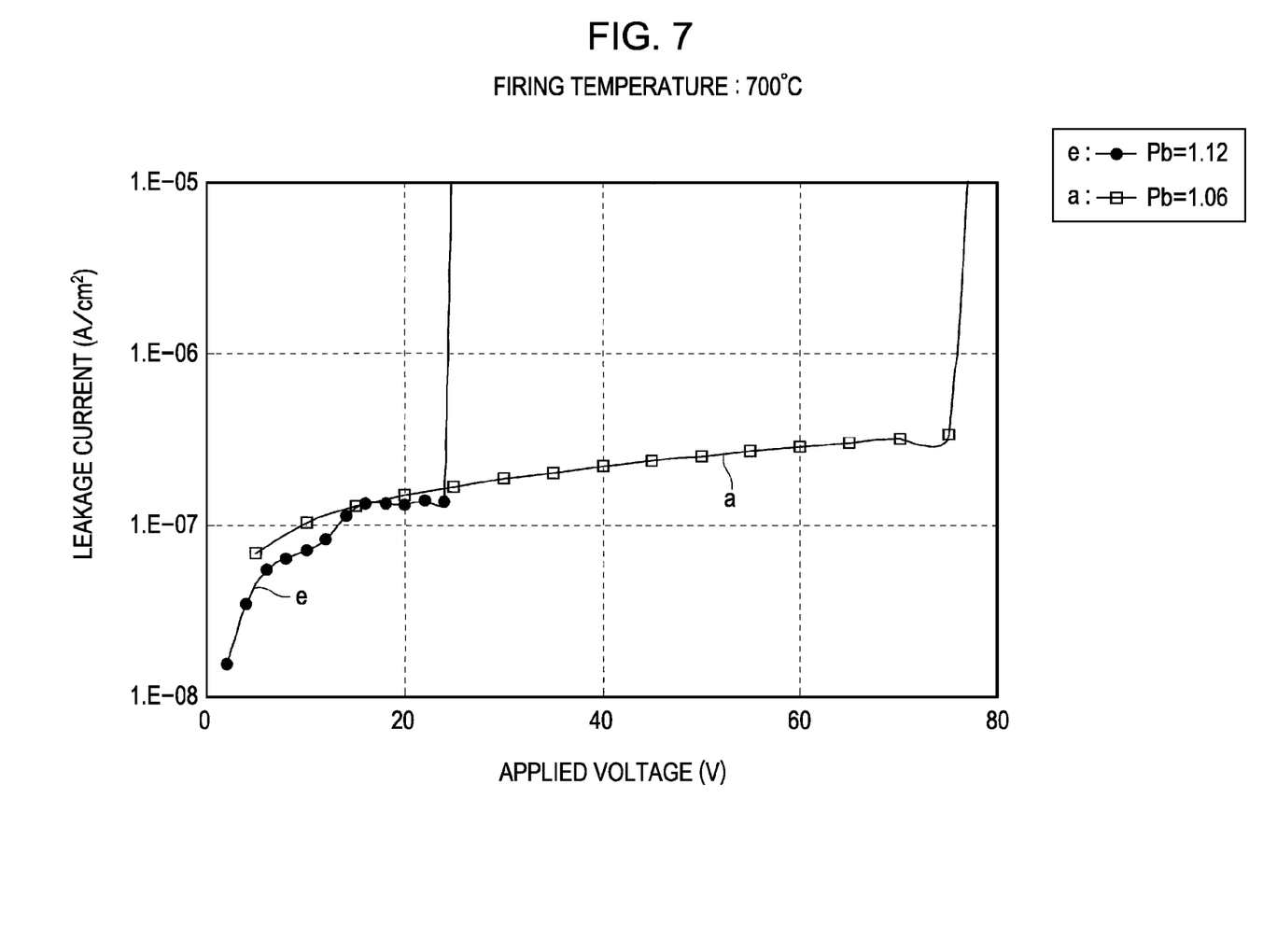
FIG. 7 is a graph showing leakage current characteristics determined in an experiment.

FIG. 7 shows the leakage current of each sample prepared at a firing temperature of 700° C. With reference to FIG. 7, a line denoted by Symbol a shows results obtained from Sample a that was prepared in substantially the same manner as that used to prepare Sample 1c except that Sample a was prepared at a firing temperature of 700° C. A line denoted by Symbol e in FIG. 7 shows results obtained from Sample e that was prepared in substantially the same manner as that used to prepare Sample 1c except that Sample e was prepared at a firing temperature of 700° C. and Pb=1.12. FIG. 7 illustrates substantially the same tendency as that shown in FIG. 6. That is, Sample a, which corresponds to an example, has a dielectric strength of about 80 V or more and Sample e, which corresponds to a comparative example, has a dielectric strength of about 25 V or less.

4. Droplet-Ejecting Apparatus

Figure 9:
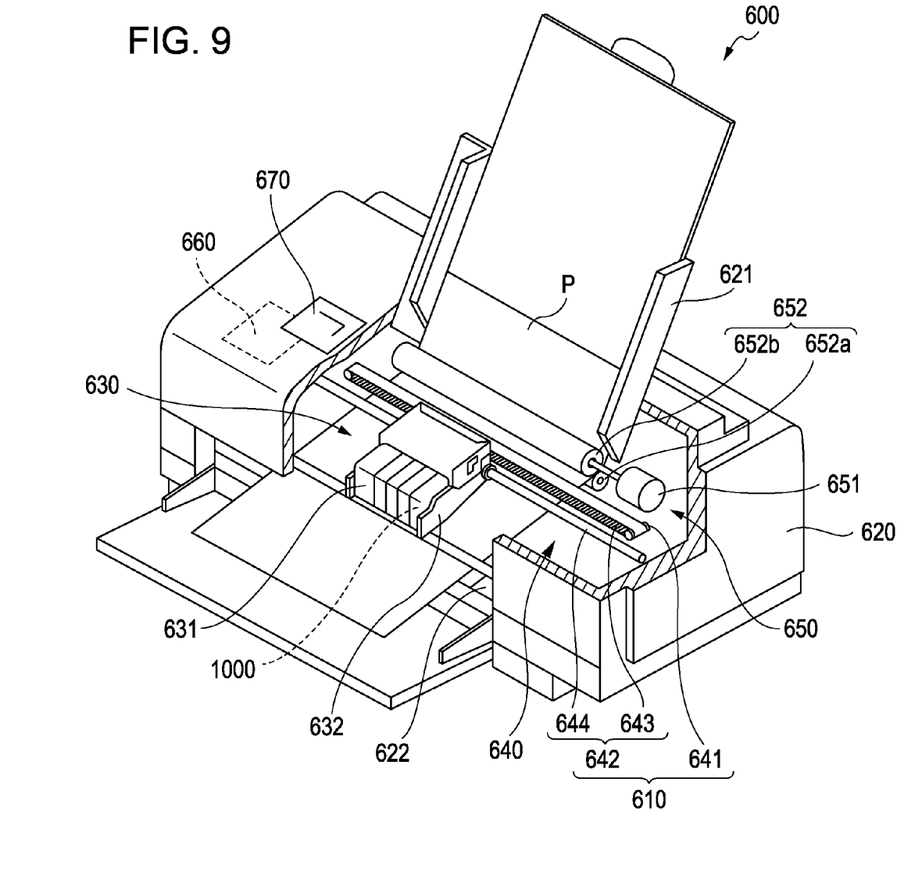
FIG. 9 is a schematic view of a droplet-ejecting apparatus according to an embodiment of the present invention.

A droplet-ejecting apparatus 600 according to an embodiment of the present invention will now be described. The droplet-ejecting apparatus 600 includes the droplet-ejecting head 1000 and is a type of ink jet droplet-ejecting apparatus. FIG. 9 is a perspective view of the droplet-ejecting apparatus 600.

The droplet-ejecting apparatus 600 includes a head unit 630, a head unit-driving section 610, and a control section 660. The droplet-ejecting apparatus 600 may further include an apparatus body 620, a sheet-feeding section 650, a tray 621 for holding a recording sheet P, a discharge port 622 for discharging the recording sheet P, and an operating panel 670 disposed on the upper surface of the apparatus body 620.

The head unit 630 includes the droplet-ejecting head 1000. The head unit 630 further includes an ink cartridge 631 for supplying ink to the droplet-ejecting head 1000 and a transport section (carriage) 632 carrying the droplet-ejecting head 1000 and the ink cartridge 631.

The head unit-driving section 610 can reciprocate the head unit 630. The head unit-driving section 610 includes a carriage motor 641 serving as a driving source of the head unit 630 and a reciprocating mechanism 642 that receives torque from the carriage motor 641 to reciprocate the head unit 630.

The reciprocating mechanism 642 includes a carriage guide shaft 644 of which both ends are supported with a frame (not shown) and also includes a timing belt 643 extending in parallel to the carriage guide shaft 644. The carriage guide shaft 644 supports the carriage 632 such that the carriage 632 can freely reciprocate. The carriage 632 is fixed to a portion of the timing belt 643. When the timing belt 643 is run by the operation of the carriage motor 641, the head unit 630 is guided along the carriage guide shaft 644 to reciprocate. Ink is appropriately ejected from the droplet-ejecting head 1000 during the reciprocation of the head unit 630, whereby the recording sheet P is subjected to printing.

The control section 660 can control the head unit 630, the head unit-driving section 610, and the sheet-feeding section 650.

The sheet-feeding section 650 can transport the recording sheet P from the tray 621 to the head unit 630. The sheet-feeding section 650 includes a sheet-feeding motor 651 serving as a driving source thereof and a sheet-feeding roller unit 652 driven by the operation of the sheet-feeding motor 651. The sheet-feeding roller unit 652 includes a driven roller 652*a* and driving roller 652*b* which are vertically arranged opposite each other such that the passage of the recording sheet P is sandwiched therebetween. The driving roller 652*b* is connected to the sheet-feeding motor 651.

The head unit 630, the head unit-driving section 610, the control section 660, and the sheet-feeding section 650 are arranged in the apparatus body 620.

In this embodiment, the droplet-ejecting apparatus 600 has been described to be a type of ink jet droplet-ejecting apparatus. The droplet-ejecting apparatus 600 can be used as an industrial droplet-ejecting apparatus. Examples of a liquid (liquid material) ejected from the droplet-ejecting apparatus 600 include various functional materials and materials each having a viscosity appropriately adjusted with a dispersion medium.

While the embodiments of the present invention have been described above in detail, those skilled in the art can readily appreciate that various modifications can be made without departing from the spirit and scope of the present invention. Therefore, such modifications are within the scope of the present invention.

What is claimed is:

1. A droplet-ejecting head comprising: a substrate having a pressure chamber; a piezoelectric element which is disposed on the substrate and which includes a first electrode, a second electrode, and a piezoelectric layer disposed between the first and second electrodes, the piezoelectric layer being made of a lead zirconate titanate ferroelectric; and a nozzle plate having a nozzle hole communicating with the pressure chamber, wherein the first electrode includes at least one lanthanum nickelate layer which is located on the piezoelectric layer side and which is made of lanthanum nickelate, the piezoelectric layer has a distribution in which the concentration of lanthanum is distributed in a first region, the concentration of the lanthanum decreasing from the interface between the lanthanum nickelate layer and the piezoelectric layer toward the second electrode such that the lanthanum is only partly distributed in the piezoelectric layer, and wherein the piezoelectric layer has a distribution in which the concentration of nickel is distributed in a second region that is wider than the first region, the concentration of the nickel decreasing from the interface between the lanthanum nickelate layer and the piezoelectric layer towards the second electrode such that the nickel is globally distributed in the piezoelectric layer.

2. A method for manufacturing a droplet-ejecting head, comprising: preparing a substrate; forming a first electrode on the substrate; forming a piezoelectric layer on the first electrode; forming a second electrode on the piezoelectric layer; forming a pressure chamber in the substrate; and forming a nozzle plate having a nozzle hole communicating with the pressure chamber, wherein the formation of the first electrode includes forming a lanthanum nickelate layer made of lanthanum nickelate on the piezoelectric layer side, the piezoelectric layer is formed by a solution process, the solution process uses a material in which the molar proportion of lead is 1.04 to 1.08 with respect to the sum of zirconium and titanium, and heat treatment for crystallization is performed at 700° C. or higher in the formation of the piezoelectric layer, wherein the piezoelectric layer has a distribution in which the concentration of lanthanum is distributed in a first region, the concentration of the lanthanum decreasing from the interface between the lanthanum nickelate layer and the piezoelectric layer toward the second electrode such that the lanthanum is only partly distributed in the piezoelectric layer, and wherein the piezoelectric layer has a distribution in which the concentration of nickel is distributed in a second region that is wider than the first region, the concentration of the nickel decreasing from the interface between the lanthanum nickelate layer and the piezoelectric layer towards the second electrode such that the nickel is globally distributed in the piezoelectric layer.

3. The method according to claim 2, wherein heat treatment for crystallization is performed at a temperature of 750° C. to 850° C. in the formation of the piezoelectric layer.

4. A droplet-ejecting apparatus comprising the droplet-ejecting head according to claim 1.

* * * * *